(12) United States Patent
Kanakarajan

(10) Patent No.: US 7,338,715 B2
(45) Date of Patent: Mar. 4, 2008

(54) LOW TEMPERATURE CURE POLYIMIDE COMPOSITIONS RESISTANT TO ARC TRACKING AND METHODS RELATING THERETO

(75) Inventor: Kuppusamy Kanakarajan, Dublin, OH (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/322,586

(22) Filed: Dec. 30, 2005

(65) Prior Publication Data

US 2007/0154726 A1 Jul. 5, 2007

(51) Int. Cl.
*B32B 27/06* (2006.01)
*B32B 15/08* (2006.01)
*C08L 79/08* (2006.01)
*C08G 73/10* (2006.01)

(52) U.S. Cl. .................. 428/458; 524/538; 525/432; 528/353

(58) Field of Classification Search ............... 528/125, 528/126, 128, 172–174, 176, 179, 183, 185, 528/188, 220, 229, 350, 352, 353; 428/1.26, 428/457, 458, 411.1, 473.5; 525/432; 524/538
See application file for complete search history.

(56) References Cited

U.S. PATENT DOCUMENTS

| 5,104,966 | A | * | 4/1992 | David ..................... 528/310 |
|---|---|---|---|---|
| 5,106,673 | A | | 4/1992 | Effenberger et al. |
| 5,166,308 | A | | 11/1992 | Kreuz et al. |
| 5,220,133 | A | | 6/1993 | Sutherland et al. |
| 5,238,748 | A | | 8/1993 | Effenberger et al. |
| 5,298,331 | A | * | 3/1994 | Kanakarajan et al. ....... 428/458 |
| 5,596,435 | A | * | 1/1997 | Sunohara et al. ........... 349/132 |
| 5,731,088 | A | | 3/1998 | LaCourt |
| 6,492,030 | B1 | * | 12/2002 | Hashimoto et al. ......... 428/447 |
| 7,026,436 | B2 | * | 4/2006 | Kanakarajan ................ 528/310 |
| 2004/0099374 | A1 | * | 5/2004 | Kanakarajan ............. 156/345.1 |
| 2005/0037213 | A1 | * | 2/2005 | Kihara et al. ............... 428/458 |
| 2005/0100719 | A1 | * | 5/2005 | Kanakarajan et al. ....... 428/209 |

FOREIGN PATENT DOCUMENTS

JP 1996/250860 A 9/1996

* cited by examiner

*Primary Examiner*—Ana Woodward

(57) ABSTRACT

The polyimides of the present invention are derived from aliphatic diamines and show advantageous arc tracking performance (i.e., low arc tracking). These polyimides can be cured at low temperatures making them suitable as coverlay compositions in electronic circuitry. In addition, these polyimides are soluble and excellent in heat resistance and adhesion properties, showing a low dielectric constant even at 10 GHz or more.

4 Claims, No Drawings

LOW TEMPERATURE CURE POLYIMIDE COMPOSITIONS RESISTANT TO ARC TRACKING AND METHODS RELATING THERETO

FIELD OF THE INVENTION

The present invention relates generally to compositions resistant to arc tracking, comprising a low dielectric constant (or 'low-k') polyimide derived from at least one aliphatic diamine. More specifically, the polyimide compositions of the present invention can be applied to printed wiring boards and flexible printed circuits, requiring a low temperature curing coverlay dielectric layer.

BACKGROUND OF THE INVENTION

Broadly speaking, metal-clad laminates (for printed wiring board substrates) are known. As the electronics industry progresses, such laminates must accommodate increasingly smaller circuitry that is operating at increasingly higher speeds. Generally speaking, a shorter time delay (of signal transmission rate) is possible by making the insulating layer thinner, while also reducing its dielectric constant. A dielectric having a low dielectric constant, e.g., having a dielectric constant lower than 4.3, 4.1, 4.0, 3.7, 3.5, 3.2, 2.0, 2.9, 2.8, 2.7, 2.6, 2.5, 2.4, 2.2, 2.0, 1.9, 1.8, 1.7, 1.6, or 1.5, will hereafter be referred to as a "low-k dielectric."

A low-k dielectric can sometimes fail due to arc-tracking. The low-k dielectric separates two conductive paths, and any electric arc (over the dielectric) will typically cause a short circuit. Such arc tracking can cause catastrophic failure.

Japanese Patent Application Laid-Open No. 8-250860 discloses a metal foil-clad laminate obtained by applying an aromatic polyamic acid solution onto a metal foil and then heat-treating the applied solution to imidize the aromatic polyamic acid. However, the process may become increasingly costly (and prone to quality errors), particularly as circuitry designs become more advanced.

Generally speaking, polyimides obtained from aliphatic (chain) tetracarboxylic dianhydride can have an advantageously low dielectric constant, but such polyimides also tend to have poor heat resistance (for processes such as welding), thereby greatly reducing their practical utility. Although polyimides obtained from alicyclic tetracarboxylic anhydrides have improved heat resistance (as compared to those obtained from the aliphatic chain tetracarboxylic dianhydride), such polyimides tend to have low solubility to solvents and can therefore be difficult to coat onto another substrate, such as metal. Although polyimides derived from compositions, such as, 1,2,4,5-cyclopentanetetracarboxylic dianhydride and bicyclo[2.2.2]octa-7-ene-2,3,5,6-tetracarboxylic dianhydride, can have adequate solvent solubility, the resulting laminate can have unacceptably poor flexibility.

SUMMARY OF THE INVENTION

The compositions of the present invention comprise a polyimide based low-k dielectric material having advantageous solvent solubility and resistance to heat. The low-k dielectric material can also provide advantageous bonding properties for adhesion to an additional layer, such as a metal layer.

The low-k dielectric material comprises at least one polyimide (the base polymer) having repeating units represented by the following formula:

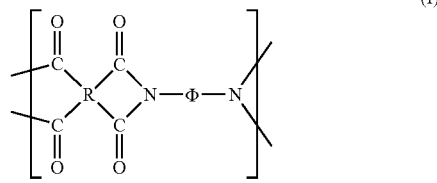

where:
R comprises an aromatic moiety;
φ is an aliphatic moiety, such as, a $C_2$ to $C_{39}$ divalent aliphatic, and
R and/or φ further comprise one or more of the following moieties:
1. —O—,
2. —$SO_2$—,
3. —CO—,
4. —C($CH_3$)$_2$—,
5. —OSi($CH_3$)$_2$—,
6. —$C_2H_4$O—,
7. —S—, and
8. any halogen The content of the repeating unit represented by the formula I (immediately above) is preferably 10 to 100 mol % and more preferably 50 to 100 mol % of the total repeating units. The number of the repeating units represented by the formula I in one molecule of the polyimide is preferably 10 to 2000 and more preferably 20 to 200.

The low-k dieletric can comprise other polyimides or fillers, so long as the low-k dielectric material has an actual or apparent glass transition temperature of 350° C. or less, and a dielectric constant of 3.2 or less at 10 GHz. Generally, the low-k dielectric will contain a weight percentage of the base polymer in a range between and including any two of the following weight percentages: 40, 50, 60, 65, 70, 75, 80, 82, 84, 86, 88, 90, 91, 92, 93, 94, 95, 96, 97, 98, 99 and 100 weight percent (based upon the total weight of the low-k dielectric).

In one embodiment, the low-k dielectric is provided as a film in a laminate structure comprising a metal layer and a low-k dielectric layer. In such an embodiment, the laminate can be manufactured by applying a solution (using an organic solvent) of the above low-k dielectric material onto a metal foil and then evaporating away the volatiles.

Alternatively thermopress-bonding can be used to bond a film (made of the low-k dielectric) to a metal foil. In yet another embodiment, the metal film is deposited upon a film of low-k dielectric, such as, by sputtering, vapor deposition, electroless plating or the like. The metal layer may be formed on one or both surfaces of the low-k dielectric. In a related embodiment, the flexible metal-clad laminate may be further laminated with another flexible metal-clad laminate or with a rigid printed wiring board of any type.

In related embodiment of the present invention, circuit patterns may be formed in the surface metal layer. The flexible metal-clad laminate (having the circuit patterns formed therein) may be laminated with another flexible metal-clad laminate, or a plurality of flexible metal-clad laminates (having circuit patterns formed therein) may be laminated with each other.

In another related embodiment of the present invention, a protective cover layer made of the low-k dielectric may be formed over a surface upon which circuit patterns are formed. In one embodiment, the cover layer may be patterned by a wet etching method using an aprotic organic polar solvent as an etchant.

DETAILED DESCRIPTION OF THE PREFERRED EMBODIMENTS

The low-k dielectric materials of the present invention are derived from aliphatic diamines and provide diminished arc tracking performance relative to many conventional low-k dielectric materials. These polyimides can be cured at low temperatures making them suitable as coverlay compositions in electronic circuitry. In addition, the polyimides of the present invention are generally soluble in organic solvents with excellent heat resistance and adhesion properties, providing low-k dielectric properties even at a high frequency range.

The base polymer (polyimide) of the present invention can be used as a base layer of a composite for use in hybrid wire constructions, which further comprise one or more layers of fluoropolymer based material.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the dianhydride as used herein is intended to mean the component that reacts with (is complimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e., a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

A polyimide film according to the present invention can be produced by combining the diamine and dianhydride (monomer or other polyimide precursor form) together with a solvent to form a polyamic acid (also called a polyamide acid) solution. The dianhydride and diamine can be combined in a molar ratio of about 0.90 to 1.10. Molecular weight of the polyamic acid formed therefrom can be adjusted by adjusting the molar ratio of the dianhydride and diamine.

Applicants determined that certain organic solvents (or mixture of solvents) are particularly suited for both the synthesis of the polyimides and the formation of the polyimide solutions and pastes of the present invention. These preferred solvents are BLO, γ-valerolactone (GV), α-methyl-γ-butyrolactone (MBL), tetrahydrofurfural acetate, propiophenone, acetophenone, methyl benzoate, phenyl acetate and 2-phenoxyethanol.

In one embodiment, a polyamic acid casting solution is derived from the polyamic acid solution. The polyamic acid casting solution preferably comprises the polyamic acid solution combined with conversion chemicals like: (i.) one or more dehydrating agents, such as, aliphatic acid anhydrides (acetic anhydride, etc.) and/or aromatic acid anhydrides; and (ii.) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material is often used in molar excess compared to the amount of amide acid groups in the polyamic acid. The amount of acetic anhydride used is typically about 2.0-3.0 moles per equivalent of polyamic acid. Generally, a comparable amount of tertiary amine catalyst is used. In one embodiment, the polyamic acid solution, and/or the polyamic acid casting solution, is dissolved in an organic solvent at a concentration from about 5.0 to 10% to about 15, 20, 25, 30, 35 and 40% by weight.

The polyamic acid (and casting solution can further comprise any one of a number of additives, such as processing aids (e.g., oliogmers), antioxidants, light stabilizers, flame retardant additives, anti-static agents, heat stabilizers, ultraviolet absorbing agents, inorganic fillers or various reinforcing agents. These inorganic fillers include thermally conductive fillers, like metal oxides, and electrically conductive fillers like metals and electrically conductive polymers. Common inorganic fillers are alumina, silica, silicon carbide, diamond, clay, boron nitride, aluminum nitride, titanium dioxide, dicalcium phosphate, and fumed metal oxides. Common organic fillers include polyaniline, polythiophene, polypyrrole, polyphenylenevinylene, polydialkylfluorenes, carbon black, and graphite.

The solvated mixture (the polyamic acid casting solution) can then be cast or applied onto a support, such as an endless belt or rotating drum, to give a film. Next, the solvent containing-film can be converted into a self-supporting film by baking at an appropriate temperature (thermal curing)

together with conversion chemical reactants (chemical curing). The film can then be separated from the support, oriented such as by tentering, with continued thermal and chemical curing to provide a polyimide film.

Useful methods for producing polyimide film in accordance with the present invention can be found in U.S. Pat. No. 5,166,308 and U.S. Pat. No. 5,298,331 and are incorporated by reference into this specification for all teachings therein. Numerous variations are also possible, such as, (a) A method wherein the diamine components and dianhydride components are preliminarily mixed together and then the mixture is added in portions to a solvent while stirring.
(b) A method wherein a solvent is added to a stirring mixture of diamine and dianhydride components. (Contrary to (a) above.)
(c) A method wherein diamines are exclusively dissolved in a solvent and then dianhydrides are added thereto at such a ratio as allowing to control the reaction rate.
(d) A method wherein the dianhydride components are exclusively dissolved in a solvent and then amine components are added thereto at such a ratio to allow control of the reaction rate.
(e) A method wherein the diamine components and the dianhydride components are separately dissolved in solvents and then these solutions are mixed in a reactor.
(f) A method wherein the polyamic acid with excessive amine component and another polyamic acid with excessive dianhydride component are preliminarily formed and then reacted with each other in a reactor, particularly in such a way as to create a non-random or block copolymer.
(g) A method wherein a specific portion of the amine components and the dianhydride components are first reacted and then the residual diamine components are reacted, or vice versa.
(h) A method wherein the conversion chemicals are mixed with the polyamic acid to form a polyamic acid casting solution and then cast to form a gel film.
(i) A method wherein the components are added in part or in whole in any order to either part or whole of the solvent, also where part or all of any component can be added as a solution in part or all of the solvent.
(j) A method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The thickness of the polyimide film may be adjusted depending on the intended purpose of the film or final application specifications. It is generally preferred that the thickness of the film ranges from 2, 3, 5, 7, 8, 10, 12, 15, 20, or 25 microns to about 25, 30, 35, 40, 45, 50, 60, 80, 100, 125, 150, 175, 200, 300, 400 or 500 microns. Preferably, the thickness is from about 8 to about 125 microns, more preferably from 12 to 25 microns.

In one embodiment, useful aliphatic diamines have the following structural formula: $H_2N-R-NH_2$, where R is an aliphatic moiety, such as a substituted or unsubstituted hydrocarbon in a range from 4, 5, 6, 7 or 8 carbons to about 9, 10, 11, 12, 13, 14, 15, or 16 carbon atoms, and in one embodiment the aliphatic moiety is a $C_6$ to $C_8$ aliphatic.

In one embodiment, R is a $C_6$ straight chain hydrocarbon, known as hexamethylene diamine (HMD or 1,6-hexanediamine). In other embodiments, the aliphatic diamine is an alpha, omega-diamine; such diamines can be more reactive than alpha, beta-aliphatic diamines.

In one embodiment, to achieve low temperature bonding ("low temperature bonding" is intended to mean bonding in a range of from about 180, 185, or 190° C. to about 195, 200, 205, 210, 215, 220, 225, 230, 235, 240, 245 and 250° C.), the mole % of aliphatic diamine (based upon total diamine) is in a range from about 50, 55, 60, 65, or 70 to about 75, 80, 85 or 90 mole %. In this embodiment, if less than 50 mole % of the diamine component is aliphatic diamine, the resulting polyimide can sometimes have an unduly high glass transition temperature ("$T_g$") which can be detrimental to low temperature bonding. In one embodiment, if more than 90 mole % of the diamine component is an aliphatic diamine, then any resulting polyimide film can become too brittle for some flexible material applications.

In one embodiment, as the aliphatic diamine to aromatic diamine ratio increases, the glass transition temperature (Tg) of the polyimide and lamination temperature will generally tend to decrease. In one embodiment, for bonding to metal to properly occur, the lamination temperature is typically about 25° C. higher than the glass transition temperature of the polyimide adhesive. For example, if the glass transition temperature of the polyimide is in the range of about 150° C. to 200° C., then the optimal bonding temperature will be in the range of about 180° C. to 250° C.

In one embodiment, the aliphatic diamine is 75±10, 8, 6, 4, 2 or 1 mole % hexamethylene diamine (HMD) and the aromatic diamine is 25±10, 8, 6, 4, 2 or 1 mole %, 1,3-bis-(4-aminophenoxy) benzene (APB-134, RODA). Here, the glass transition temperature of the polyimide adhesive is in a range of about 175±10° C. At a lamination temperature (bonding temperature) of about 200±10, 8, 6, 4, 2 or 1° C., the polyimide adhesive can be a viable substitute for an acrylic or epoxy coverlay composition, compositions commonly used as conformal coatings and encapsulates in electronics applications.

Depending upon the particular embodiment of the present invention, other suitable aliphatic diamines include, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. The preferred aliphatic diamine is hexamethylene diamine (HMD).

In one embodiment, the films of the present invention are used as a coverlay film. Coverlay films are laminated to etched circuitry traces (metal traces) of a flexible printed circuit board. The adhesive polyimide encapsulates the copper circuitry, protecting it from the environment and providing electrical and thermal insulation. The flexible printed circuit board, covered with the films of the present invention, may be single sided, double sided, or be incorporated into a stack of several individual flexible printed circuits to form what is commonly referred to as a multilayer board. Any of these types of circuits may be used in a solely flexible printed circuit or may be combined with rigid circuitry applications to form a rigid/flex or flex/rigid printed wiring board.

Examples of tetracarboxylic acids and derivatives thereof, useful in the polymerization of the polyimide base polymers of the present invention include pyromellitic acid, 3,3',4,4'-biphenyltetracarboxylic acid, 2,3,3',4' biphenyltetracarboxylic acid, 2,2-bis(3,4-dicarboxyphenyl-)propane, 2,2-bis(2,3-dicarboxyphenyl)propane, 2,2-bis(3,4-dicarboxyphenyl-)-1,1,1,3,3,3-hexafluoropropane, 2,2-bis(2,3-dicarboxyphenyl)-1,1,1,3,3,3-hexafluoropropane, bis(3,4-dicarboxyphenyl) sulfone, bis(3,4-dicarboxyphenyl) ether, bis(2,3-dicarboxyphenyl) ether, 3,3',4,4'-benzophenonetetracarboxylic acid, 2,2',3,3'-benzophenonetetracarboxylic acid, 4,4-(p-phenylenedioxy)diphthalic acid, 4,4-(m-phenylenedioxy)diphthalic acid, ethylenetetracarboxylic acid, 1,2,3,4-butanetetracarboxylic acid, 1,2,3,4-cyclobutanetetracarboxylic acid, 1,2,4,5-cyclopentanetetracarboxylic acid, 3-carboxymethyl-1,2,4-cyclopentanetricarboxylic acid, bicyclo[2.2.2]octa-7-ene-2,3,5,6-tetracarboxylic acid, dicyclohexyltetracarboxylic acid, 1,1-bis(2,3-dicarboxyphenyl)ethane, bis(2,3-dicarboxyphenyl)methane, bis(3,4-dicarboxyphenyl) methane and derivatives thereof.

Examples of the diamine-related component include diamines, diisocyanates and diaminodisilanes, with diamines being preferred. The diamines of the present invention are aliphatic diamines. The "aliphatic diamine" means a diamine having amino groups directly bonded to an aliphatic or alicyclic group, which may contain another substituent in its structure. In general, when the aliphatic diamine is used as a component, it is rather difficult to obtain a high molecular polyimide, because the intermediate polyamic acid and the aliphatic diamine form a strongly bonded complex. Therefore, it is necessary to take suitable measures such as the use of a solvent having a relatively high dissolving power to the complex, for example, cresol. On the other hand, when the cyclohexanetetracarboxylic acid or its derivative is used together with the aliphatic diamine as constituting components, the molecular weight of the polyimide is easily increased, because the intermediate polyamic acid and the aliphatic diamine form a relatively weakly bonded complex.

Examples of useful aliphatic diamines in accordance with the present invention include 4,4'-diaminodicyclohexylmethane, ethylenediamine, hexamethylenediamine, polyethylene glycol bis(3-amonopropyl) ether, polypropylene glycol bis(3-aminopropyl) ether, 1,3-bis(aminomethyl) cyclohexane, 1,4-bis(aminomethyl)cyclohexane, m-xylylenediamine, p-xylylenediamine, isophoronediamine, norbornanediamine, and siloxanediamine.

In the present invention, the polyimide A is usually produced in the form of a solution in organic solvent. Examples of the organic solvents include N-methyl-2-pyrrolidone, N,N-dimethylacetoamide, N,N-dimethylformamide, dimethylsulfoxide, hexamethylphosphoraimde, tetramethylenesulfone, p-chlorophenol, m-cresol and 2-chloro-4-hydroxytoluene.

A solution of the base polymer (polyimide) in organic solvent can be produced by the following methods (i) to (iii):
(i) After adding the tetracarboxylic acid component to an organic solvent solution of the diamine-related component or adding the diamine-related component to an organic solvent solution of the tetracarboxylic acid component, the resultant mixture is maintained preferably at 80 C or lower and more preferably at about room temperature or lower for 0.5 to 3 h. After added with an azeotropic dehydrating solvent such as toluene and xylene, the resultant solution of the intermediate polyamic acid is subjected to dehydration while azeotropically removing the generated water out of the reaction system to obtain a solution of the polyimide A in organic solvent.
(ii) After imidating the intermediate polyamic acid by adding a dehydrating agent such as acetic anhydride into a solution of the polyamic acid, the polyimide A is precipitated by adding a poor solvent for the polyimide A such as methanol. The solid polyimide A separated by filtering, washing and drying is dissolved in a solvent such as N,N-dimethylacetamide to obtain a solution of the polyimide A in organic solvent.
(iii) A solution of the polyamic acid prepared by using a high-boiling solvent such as cresol is maintained at 150 to 220 C for 3 to 12 h to allow the imidation to proceed. Then, the polyimide A is precipitated by adding a poor solvent for the polyimide A such as methanol. The solid polyimide A separated by filtering, washing and drying is dissolved in a solvent such as N,N-dimethylacetamide to obtain a solution of the polyimide A in organic solvent. The concentration of the base polymer in the organic solvent solution is preferably 5 to 50% by weight and more preferably 10 to 40% by weight.

In the present invention, the polyimide layer is formed by applying the organic solvent solution of the base polymer which is produced by any of the above methods (i) to (iii) on a metal foil, etc., and then evaporating the solvent by heating. Alternatively, a polyimide film previously produced from the organic solvent solution can be used as the polyimide layer. In that case the polyimide film may be produced by applying the organic solvent solution of the polyimide base polymer on a substrate such as a glass plate and a metal plate, evaporating the solvent by heating at 200 to 350 C, and then separating the film from the substrate. Alternatively, the polyimide film may be produced by applying the organic solvent solution of polyamic acid on a substrate such as a glass plate and a metal plate, and then allowing the dehydrating imidation to proceed by heating at 200 to 350 C. The polyimide layer preferably has a thickness of 10 to 100 microns.

The polyimides of the present invention are suitable as an insulating material because the dielectric constant is low at high frequencies, and, in addition thereto, the frequency dependency of dielectric constant is small in the practically important frequency range of 1 to 20 GHz and the dielectric constant is substantially unchanged in the frequency range. The use of the aliphatic diamine is particularly preferred because a dielectric constant of 2.8 or lower at 10 GHz is achieved. The lowest dielectric constant to be achieved is usually 2.6. In addition, excellent high-frequency property of the polyimides of the present invention is exemplified by the characteristics that a dielectric loss tangent has a small frequency dependency and is substantially constant within the range of 0.008 to 0.018 in a frequency range of 1 to 20 GHz.

The low-k dielectric films made of the polyimide base polymer of the present invention should have a glass transition temperature of about 350 C or lower. The low-k dielectric films of the present invention exhibit advantageous adhesion properties at its glass transition temperature or higher, although adhesion properties can vary depending upon the residual amount of solvent. If the glass transition temperature is too high, a high thermopress-bonding temperature can be correspondingly required. If the glass transition temperature is too low, the heat resistance of the film itself can become insufficient. The glass transition temperature is preferably 200 to 350 C and more preferably 250 to 320 C.

Examples of the material of the metal foil for forming the metal layer include copper, aluminum, stainless steel, gold, silver and nickel, with copper, aluminum and stainless steel being preferred. The thickness of the metal foil is not particularly limited and usually 5 to 100 microns provide excellent processability.

Useful laminates of the present invention can be achieved by thermopress-bonding a previously prepared polyimide-film and a metal foil or by thermopress-bonding two metal foils and a polyimide film interposed there between, a flexible metal-clad laminate of a polyimide layer/metal layer laminate structure or a metal layer/polyimide layer/metal layer laminate.

A flexible metal-clad laminate of a metal layer (one or more layers)/polyimide layer laminate structure or a metal layer (one or more layers)/polyimide layer/metal layer (one or more layers) can be produced by forming at least one metal thin film on one or both surfaces of the polyimide film by at least one thin film-forming method selected from the group consisting of sputtering, vapor deposition and electroless plating.

The vapor deposition include, in addition to ordinary vapor deposition methods, CVD and ion-plating. After forming the thin metal film by the above methods, additional metal film may be further formed on the previously formed metal film by another method such as electroplating (electrolytic plating) to obtain a desired thickness.

The metals for use in the thin film-forming methods are copper, nickel, chromium, tin, cobalt and gold, with copper and nickel being preferred. The thickness of the thin metal film is not particularly limited, and, in view of making full use of the thin film-forming method, preferably microns or less and more preferably 2 to 10 microns because such a range of thickness cannot be attained by other methods.

Prior to forming the thin metal film, the surface of the polyimide film may be subjected to known pretreatments such as alkaline chemical treatment, plasma treatment and sandblast treatment in order to further enhance the adhesion strength between the polyimide film and the thin metal film.

A double-sided flexible metal-clad laminate (flexible metal-clad laminate having metal layers on both surfaces) can be produced by integrally thermopress-bonding a metal foil to the polyimide layer (polyimide layer formed by applying the organic solvent solution, or polyimide film) of the flexible metal-clad laminate of a polyimide layer/metal layer laminate structure which is produced by each of the methods described above. In addition, the double-sided flexible metal-clad laminate is produced by integrally thermopress-bonding two flexible metal-clad laminates of a polyimide layer/metal layer laminate structure, which is produced by the methods described above, with the polyimide layers being opposed to each other.

A flexible, rigid metal-clad laminate can be produced by integrally thermopress-bonding a rigid printed wiring board to the metal layer or the polyimide layer of at least one of the flexible metal-clad laminate of a polyimide layer/metal layer laminate structure and the double-sided flexible metal-clad laminate, each being produced by the methods described above.

A multilayer metal-clad laminate can be produced by forming circuit patterns in the surface metal layer of the flexible metal-clad laminate of a polyimide layer/metal layer laminate structure, the double-sided flexible metal-clad laminate or the flexible, rigid metal-clad laminate, each being produced by the methods described above, thereby obtaining a printed wiring board, and then integrally thermopress-bonding at least one flexible metal-clad laminate of the present invention to the printed wiring board through the metal or polyimide layer. In addition, another multilayer metal-clad laminate having more layers can be produced by integrally thermopress-bonding a plurality of printed wiring boards through the metal or polyimide layer, which printed wiring boards are produced by forming circuit patterns in the surface metal layer of the flexible metal-clad laminate of a polyimide layer/metal layer laminate structure, the double-sided flexible metal-clad laminate, the flexible, rigid metal-clad laminate or the multilayer metal-clad laminate, each being produced by the methods described above.

By applying the organic solvent solution of the polyimide base polymer as a cover coat agent and drying, a protecting film of the polyimide A may be formed on the circuit-patterned surface metal layer of the flexible metal-clad laminate of a polyimide layer/metal layer laminate structure, the double-sided flexible metal-clad laminate, the flexible, rigid metal-clad laminate or the multilayer metal-clad laminate, each being produced by the methods described above. Alternatively, instead of applying the organic solvent solution, the protective layer may be formed by thermopress-bonding at least one polyimide film as a cover lay film to the circuit-patterned surface.

The thermopress-bonding may be performed by a hot press or may be continuously performed using pressure rollers. The thermopress-bonding temperature is preferably 200 to 400 C and more preferably 250 to 350 C. The thermopress-bonding pressure is preferably 0.1 to 200 kg/$cm^2$ and more preferably 1 to 100 kg/cm.sup.2. The thermopress-bonding may be conducted under reduced pressure to remove the solvent or bubbles. The flexible metal-clad laminate produced under the above conditions exhibits a good adhesion strength between the metal layer and the polyimide layer, for example, the adhesion strength between the polyimide layer and an electrolytic copper foil is 1 kg/$cm^2$ or higher.

The polyimide base polymer used in the present invention is soluble in an aprotic organic polar solvent. Therefore, the polyimide layer of the metal-clad laminates produced by the above methods or the polyimide layer of the printed wiring boards having circuit patterns may be patterned by wet-etching using the aprotic organic polar solvent as an etchant. The formation of viaholes or flying leads and the removal of a cover coat over terminals are considerably facilitated as compared to the conventional patterning methods by dry-etching, resulting in the considerable improvement in productivity.

The following terms (discussed above) are further described and defined below:
(1) Dielectric Constant and Dielectric Loss Tangent can be measured by a cavity resonator perturbation method using a dielectric constant/dielectric loss tangent measuring apparatuses "CP431/461/501//531" available from Kanto Electronics Application & Development Inc.
(2) Glass Transition Temperature can be determined by DSC measurement at a temperature rise rate of 10 C/min using a differential scanning calorimeter "DSC-50" available from Shimadzu Corporation.
(3) Adhesion Strength can be measured according to JIS C 6481.

What is claimed is:
1. A low-k dielectric material providing diminished arc tacking comprising:
   a base polymer polyimide having repeating units represented by the following formula I:

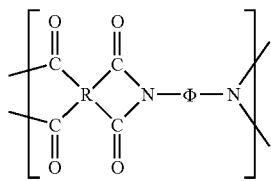

(I)

where:

R comprises an aromatic moiety;

Φ is an aliphatic moiety, and

R and Φ further comprise one or more of the following moieties:

i. —O—,
ii. —SO$_2$—,
iii. —CO—,
iv. —C(CH$_3$)$_2$—,
v. —OSi(CH$_3$)$_2$—,
vi. —C$_2$H$_4$O—,
vii. —S—, and
viii. any halogen where, the content of the repeating unit represented by the formula I is 100 mol % of the total repeating units, and the number of the repeating units represented by the formula I in one molecule of the polyimide is 10 to 2000.

2. The dielectric material of claim 1 further comprising other polyimides or fillers, provided that the low-k dielectric material exhibits a glass transition temperature of 350° C. or less, and a dielectric constant of 3.2 or less at 10 GHz.

3. The dielectric material of claim 1, wherein the base polymer is present at a weight percentage from 40 to 100 weight percent (based upon the total weight of the low-k dielectric material).

4. The dielectric material of claim 1, wherein the dielectric material is in a film configuration bonded to a metal layer.

* * * * *